United States Patent [19]

Sekine et al.

[11] 4,336,556

[45] Jun. 22, 1982

[54] SOLID-STATE IMAGE PICK-UP DEVICE

[75] Inventors: Hirokazu Sekine, Fujisawa; Nobuo Suzuki, Kamakura, both of Japan

[73] Assignee: Tokyo Shibaura Denki Kabushiki Kaisha, Japan

[21] Appl. No.: 155,974

[22] Filed: Jun. 3, 1980

[30] Foreign Application Priority Data

Jun. 8, 1979 [JP] Japan .................... 54-71280

[51] Int. Cl.$^3$ ............................... H04N 3/15
[52] U.S. Cl. .................... 358/213; 250/211 J
[58] Field of Search ............... 358/212, 213, 43, 44, 358/48; 357/24, 29-31; 250/211 J, 211 R, 578

[56] References Cited

U.S. PATENT DOCUMENTS 4,012,587  3/1977  Ochi et al. ................. 358/213
4,081,841  3/1978  Ochi et al. ................. 358/213
4,242,700  12/1980 Weimer ..................... 358/213

OTHER PUBLICATIONS

A Device Structure and Spatial Spectrum for Checker Pattern CCD Color Camera, IEEE Trans on Electron Devices, vol. ED-25, #2, pp. 261-266, (Feb. 78).
Japanese Patent No. 87,912, published on 7/31/76.
Japanese Patent No. 87,713, published on 8/6/76.

*Primary Examiner*—Michael A. Masinick
*Attorney, Agent, or Firm*—Finnegan, Henderson, Farabow, Garrett & Dunner

[57] ABSTRACT

In the disclosed solid-state image pick-up device, a plurality of pairs of picture elements are arrayed on a semiconductor substrate at a predetermined pitch interval along individual horizontal scanning lines. A plurality of shift registers are arranged for respective picture element pair columns such that they are each common to and sandwiched between the picture elements of the pairs in each column, and they serve to transfer signal charges stored in the picture elements in the direction perpendicular to the horizontal scanning line. The signal charges transferred from the pair picture elements in the individual horizontal scanning lines through the plurality of shift registers are then transferred line after line through a single shift register, which is provided in parallel to the horizontal scanning lines, to an output section.

4 Claims, 14 Drawing Figures

| | $\phi_1$ | $\phi_2$ | $\phi_1$ | $\phi_2$ | $\phi_3$ | $\phi_4$ | $\phi_3$ | $\phi_4$ |
|---|---|---|---|---|---|---|---|---|
| $t_1$ | $A_a$ | | $A_b$ | | | | | |
| $t_2$ | | $A_a$ | | $A_b$ | | | | |
| $t_3$ | | | $A_a$ | | $A_b$ | | | |
| $t_4$ | | | | $A_a$ | | $A_b$ | | |
| $t_5$ | | | | | $A_b$ | | $A_b$ | |

SOLID-STATE IMAGE PICK-UP DEVICE

BACKGROUND OF THE INVENTION

This invention relates to a solid-state image pick-up device using charge-coupled devices or like elements and, more particularly, to improvements in and relating to an inter line transfer type solid-state image pick-up device of this kind.

Figure 1:
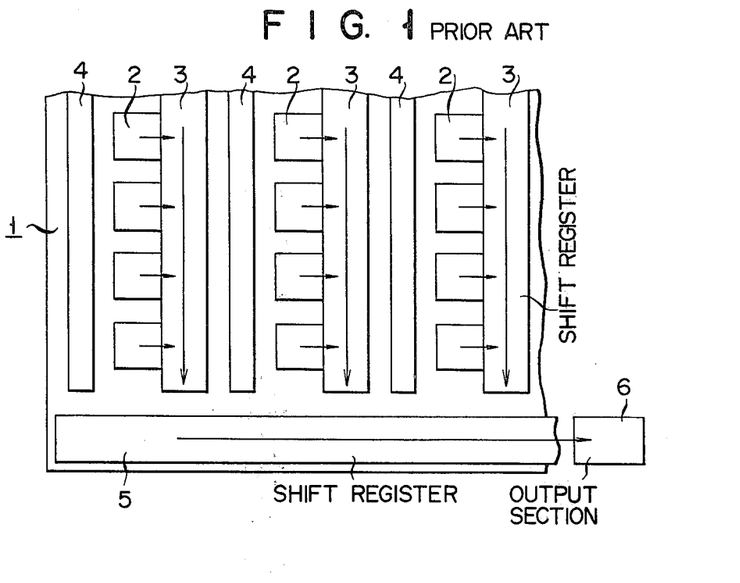
FIG. 1 is a fragmentary schematic plane view showing a prior-art solid-state image pick-up device based upon an inter-line transfer system.

Prior-art inter line transfer type solid-state image pick-up devices generally have a construction as schematically shown in FIG. 1, comprising a plurality of picture elements 2 which are arrayed in the form of a matrix on a semiconductor substrate. This device also comprises shift registers 3 each provided for the pictrue elements 2 constituting each column of the matrix. These shift registers 3 transfer signal charges, which are stored in the picture elements 2 according to light information, in the direction of the columns as shown by arrows.

The device further comprises overflow drains 4 one of which is provided for each column such that in each column the picture elements 2 are found between the associated shift register 3 and overflow drain 4. These overflow drains 4 serve to absorb the signal charges overflowing from the picture elements 2.

The signal charges for each horizontal scanning line are shifted through the plurality of shift registers and transferred to a single shift register 5 to be transferred therethough to an output section 6 of a flowing junction structure.

With the prior-art solid-state image pick-up device of the above construction, in which a shift register and an overflow drain have to be provided for the picture elements in each column, it is difficult to obtain a high degree of integration in the direction of the horizontal scanning lines, and the resolution in that direction is inferior.

In order to avoid the above drawback, there has been proposed a solid-state image pick-up device adopting an interlace image pick-up system as disclosed in Japanese Patent Publications No. 87912/1976 and No. 89713/1976. This device has a construction as shown, for instance, in FIG. 2. As is shown, picture elements 2a and 2b respectively belonging to horizontal scanning lines 10a and 10b are provided on one side of each shift register 3, and picture elements 2c and 2d belonging to the following lines 10c and 10d are provided on the other side of the shift register 3. Likewise, other pairs of picture elements 2a and 2b and other pairs of picture elements 2c and 2d, belonging to respective horizontal scanning lines 10a, 10b and 10c, 10d, are alternately provided on the opposite sides of that shift register 3.

Figure 2:
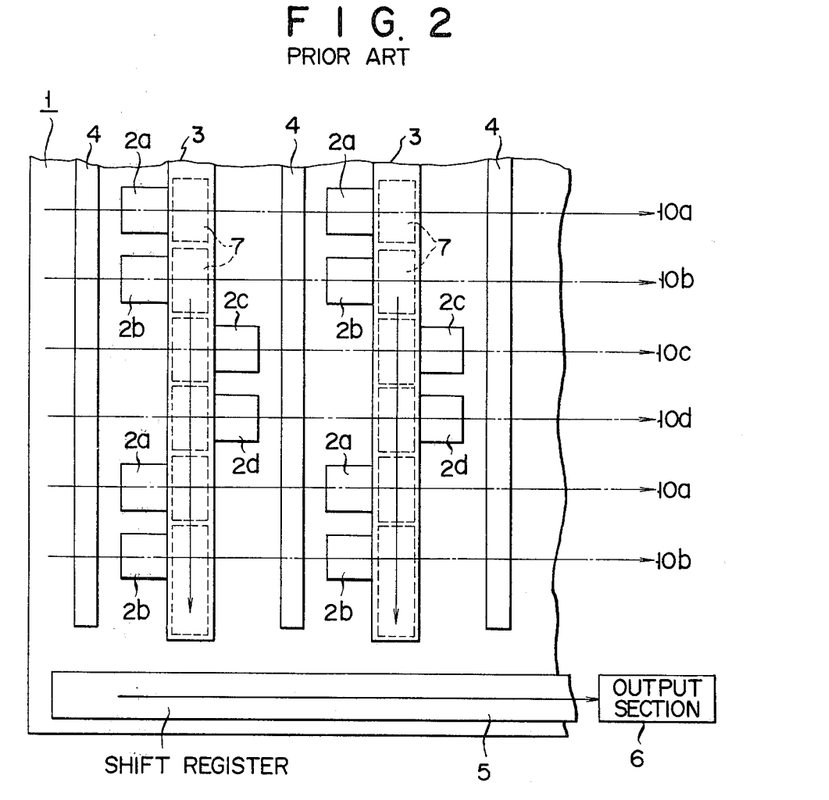
FIG. 2 is a fragmentary schematic plane view showing another prior-art solid-state image pick-up device.

The individual picture elements store respective signal charges according to light information. The signal charges stored in the picture elements 2a and 2c belonging to the scanning lines 10a and 10c, which constitute one field (hereinafter referred to as A field), are read out first. More particularly, they are transferred through the individual shift registers 3 by transfer electrodes 7 provided therein and transferred through a single shift register 5, which extends adjacent to the lower end of each of the shift registers 3, to an output section, and they are read out line after line from the output section to form the A field. At this time, the charges stored in the picture elements 2b and 2d, belonging to the horizontal scanning lines 10b and 10d which constitute the other field (hereinafter referred to as B field), are not read out. After the reading of the signal charges in the A field consisting of the horizontal scanning lines 10a and 10c is completed, the transfer and read-out of those in the B field is made to form this field.

In the solid-state image pick-up device shown in FIG. 2, one field, for instance A field, is constituted by the picture elements 2a and 2c, of which the picture elements 2a in each horizontal scanning line 10a are provided on one side of the shift registers 3 while the picture elements 2c in the next line 10c are provided on the other side of the shift registers 3. Thus, it is possible to obtain image pick-up with an apparent construction having picture elements arranged on the opposite sides of the shift registers 3 by forming a new horizontal scanning line through synthesis of adjacent two horizontal scanning lines 10a and 10c. In this case, a delay circuit for delaying, for instance, each horizontal scanning line 10a to combine this line with the next line 10c is necessary.

With such an arrangement, in which picture elements are provided on the opposite sides of each shift register 3, the number of the shift registers 3 can be reduced to one half in the case of the construction of FIG. 1, and it is thus possible to improve the degree of integration in the direction of the horizontal scanning line. However, the construction shown in FIG. 2 still has the following drawbacks.

Since the horizontal scanning lines 10a and 10c, or 10b and 10d, constitute one field, the deterioration of the image quality is inevitable when picking up a pattern having no correlation in the direction such as the so-called vertical fringes. In addition, since the delay circuit has to be provided, the signal processing circuit is complicated.

Figure 3:
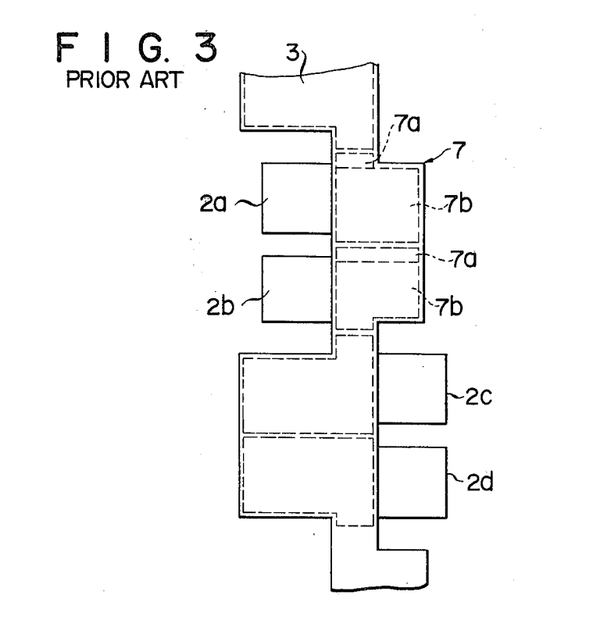
FIG. 3 is a fragmentary schematic plane view showing the construction and arrangement of shift register transfer electrodes in the solid-state image pick-up system shown in FIG. 2.

Further, the width of a transfer region constituting the transfer electrode 7 in the shift register 3 has to be made equal to the width of a storage area, and this is disadvantageous from the standpoint of the integration density. For example, with reference to FIG. 3, the transfer electrodes 7 consist of transfer regions 7a and storage regions 7b which are provided on the side of the shift register 3 free from the pair picture elements. With this construction, a directivity is imparted to the transfer of signal charges by two-phase driving. In this case, however, one of the width of the transfer regions 7a has to be made equal to the width of the associated storage area 7b as is shown, and this is disadvantageous from the standpoint of the integration density.

SUMMARY OF THE INVENTION

The invention has for its object to provide a solid-state image pick-up device, which can overcome the aforementioned drawbacks, and in which the number of shift registers for transferring picture elements is reduced to provide for the improvement of the integration density.

To achieve the above object, the solid-state image pick-up device according to the invention comprises a semiconductor substrate, which is provided with a plurality of pairs of picture elements arrayed in the form of a matrix at a predetermined pitch interval for each horizontal scanning line, a plurality of shift registers arranged common to and sandwiched between the picture elements in the pairs in each of the columns of the matrix for transferring signal charges stored in the picture elements in the direction perpendicular to the horizontal scanning line, and a single shift register in parallel to the horizontal scanning lines for transferring the signal charges transferred from the picture element pairs in each horizontal scanning line through the plurality of shift registers to an output section.

With this construction according to the invention, the following effects can be obtained.

Since the picture elements are provided on the opposite sides of each shift register, each shift register can take care of signal charges stored in two picture elements in the same horizontal scanning line. Thus, it is necessary to provide shift registers equal in number to one half the number of the picture elements in one horizontal scanning line, so that it is possible to improve the integration density.

Also, all the picture elements in one horizontal scanning line can be read out sequentially by varying the transfer speed of clock pulses impressed on the plurality of shift registers and the single shift register or by coupling the plurality of shift registers respectively to other shift registers in parallel to the single shift register, so that it is possible to dispense with delay lines that have hitherto been required and thus simplify the signal processing circuit.

Further, unlike the prior-art construction shown in FIG. 2, in which one field is constituted by every two consecutive horizontal scanning lines, according to the invention there is no need of taking the correlation between the two consecutive horizontal scanning lines, so that the deterioration of the image quality will not result even when picking up a pattern having no vertical correlation or so-called vertical fringes.

Still further, while the picture element pitch of the pair picture elements is determined by the width of one of the pair picture elements and the width of the transfer region in the transfer electrode in the shift register, the width of the transfer region does not depend upon the quantity of charge transferred through the shift register, but his region can be made as narrow as possible to improve the integration density in the direction of the horizontal scanning line.

Furthermore, it is possible to make use of a narrow channel effect by making the transfer region in the transfer electrode of the shift register narrower than the storage region. Thus, it is possible to realize two-phase driving with a potential difference provided between both the regions. In this case, if a two-layer electrode structure with two phase clock pulses impressed upon the respective two layers is adopted for the transfer electrode itself, the wiring of the transfer electrodes can be simplified to simplify the manufacture.

BRIEF DESCRIPTION OF THE DRAWINGS

FIGS. 12(A), (B), (C) and (D) are waveforms showing clock pulses supplied to shift registers provided for the individual columns of a matrix and a shift register provided for transferring signal charges to an output section in the embodiment of FIG. 4;

DETAILED DESCRIPTION OF THE PREFERRED EMBODIMENTS

Now, some preferred embodiments of the invention will be described with reference to FIGS. 4 to 14.

Figure 4:
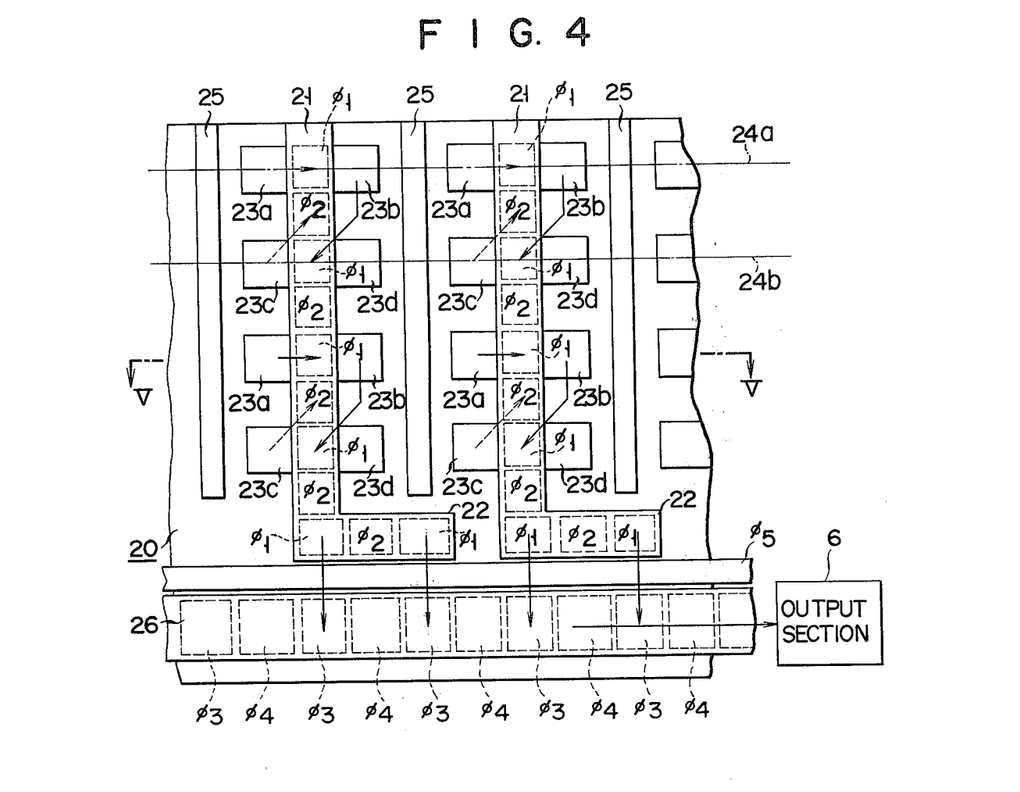
FIG. 4 is a fragmentary schematic plane view showing an embodiment of the solid-state image pick-up device according to the invention.

Referring now to FIG. 4, which shows an embodiment of the invention, a plurality of shift registers 21 for respective columns of a matrix are provided substantially at a uniform interval on a semiconductor substrate 20 of, for instance, p-conductivity type. Each shift register 21 has a continuous register section 22 extending at its lower end in the direction of the horizontal scanning line.

In each odd number order horizontal scanning line, for instance the first scanning line 24a, a pair of picture elements 23a and 23b are provided on the opposite sides of each shift register 21. Similarly, in an even number order horizontal scanning line, for instance the second scanning line 24b, a pair of picture elements 23c and 23d are provided on the opposite sides of each shift register 21. In this way, the picture elements 23a and 23b and those elements 23c and 23d are alternately provided in the respective odd and even number order horizontal scanning lines 24a and 24b.

Considering a region determined by each shift register 21 and pair of picture elements 23a and 23b on the opposite sides thereof to be a unit region in the horizontal direction, an overflow drain region 25 is provided between adjacent unit regions. In the shift register 21, including the register section 22, transfer electrodes $\phi_1$ and $\phi_2$ are arranged continuously and alternately.

A single shift register 26 is provided in parallel to the register sections 22 of the shift registers 21, i.e., parallel to the horizontal scanning lines. In the single shift register 26, transfer electrodes $\phi_3$ and $\phi_4$ are alternately arranged. A shift electrode $\phi_5$ is provided between the register section 22 of each of the shift registers 21 and the single shift register 26. The construction of this embodiment is shown as a surface channel type in the sectional view of FIG. 5. The sectional view of FIG. 5 does not exactly coincide with a sectional view of the construction of FIG. 4, which is shown schematically for convenience.

Over the aforementioned semiconductor substrate 20, various electrodes are formed via an insulating film 26. The picture elements 23a and 23b correspond to the potential well right beneath storage electrodes $\phi_6$. The signal charges from the picture elements 23a and 23b are shifted to the transfer electrodes $\phi_1$ by shift electrodes $\phi_{7a}$, and although not shown in FIG. 5, the signal charges from the picture elements 23c and 23d are shifted to the aforementioned transfer electrodes $\phi_2$ by shift electrodes $\phi_{7b}$. The shift electrodes $\phi_{7a}$ and $\phi_{7b}$ may be omitted by well-known means.

Under the insulating film 2b channel stop, regions 27 are formed at suitable intervals from one another to prevent leakage of signal charges from the shift registers 21 and picture elements 23a, 23b and 23c, 23d. The channel stop regions 27 are of the same conductivity type as the p-type semiconductor substrate 20 and indicated by P+ in FIG. 5.

Figure 5:
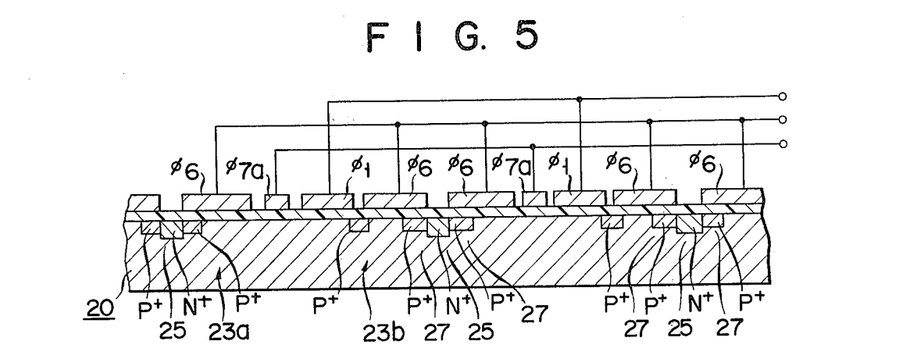
FIG. 5 is a sectional view taken along line V—V in FIG. 4.

Each overflow drain 25 is constituted by an impurity region indicated by N+ of the opposite conductivity type to the substrate 20 and sandwiched between two channel stop regions 27.

Figure 6:
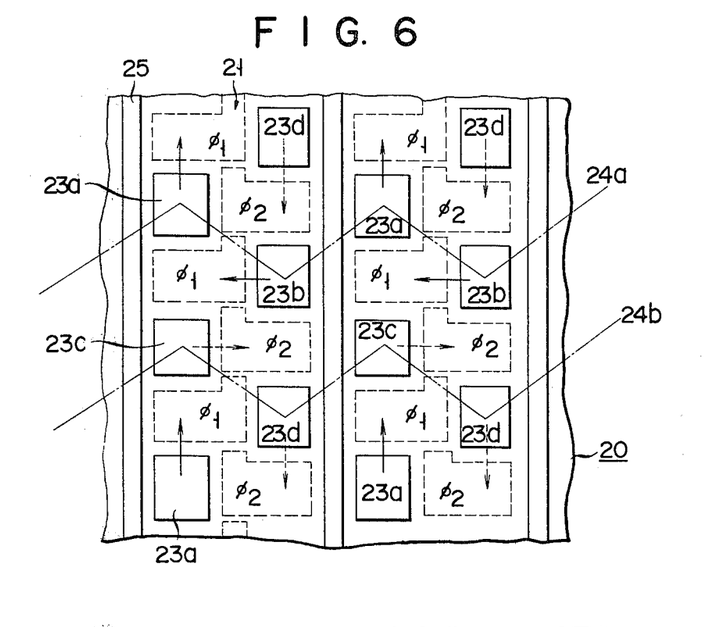
FIG. 6 is a fragmentary schematic plane view showing a specific example of the solid-state image pick-up device shown in FIG. 4.
Figure 7:
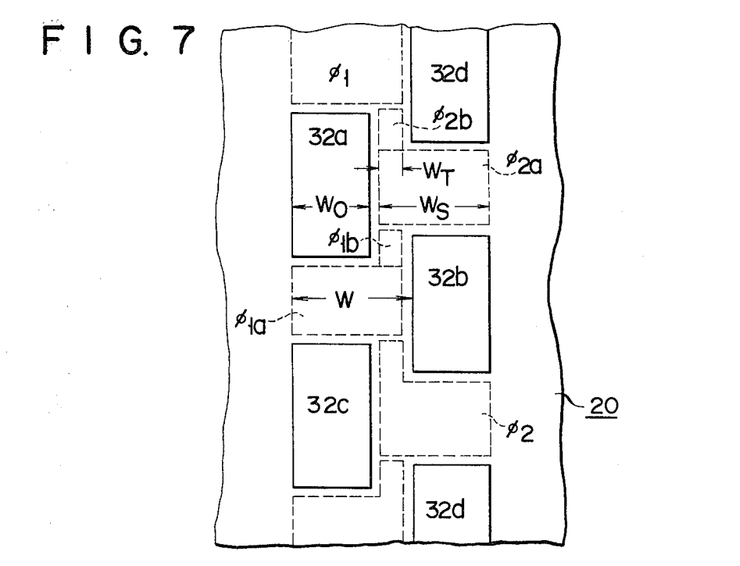
FIG. 7 is a fragmentary schematic plane view showing a specific example of the arrangement of the shift register transfer electrodes and picture elements in the device shown in FIG. 6.

FIG. 6 shows a specific example of the arrangement of the shift registers 21 and picture elements 23a, 23b and 23c, 23d. The transfer electrodes $\phi_1$ and $\phi_2$ constituting the shift register 21 have configurations as shown in FIG. 7. The transfer electrode $\phi_1$ consists of a storage region $\phi_{1a}$ with a width dimension $W_S$ and a transfer region $\phi_{1b}$ with a width dimension $W_T$, and the transfer electrode $\phi_2$ similarly consists of a storage region $\phi_{2a}$ and a transfer region $\phi_{2b}$. In this case, the picture element pitch W in the horizontal direction is determined by the width $W_O$ of the picture element and the width $W_T$ of the transfer region.

The signal charges from the picture elements 23a and 23b in the odd number order horizontal scanning lines including the first line 24a are transferred in a zig-zag fashion as shown by solid arrows in FIG. 4 or 6 to the transfer electrodes $\phi_1$, which are of the same phase but are found in different positions. The signal charges from the picture elements 23a and 23b are transferred through the shift registers 21 to the register sections 22 horizontally extending at the lower ends thereof.

In the first place, the signal charges from the pair picture elements 23a and 23b in the first horizontal scanning line 24a are transferred through the respective shift registers 21 to the register sections 22 thereof to be held therein. Then, the shift electrode $\phi_5$ is opened, whereby the signal charges are simultaneously transferred to the signal shift register 26. After being transferred to the single shift register 26, the signal charges from the pair picture elements 23a and 23b in the first horizontal scanning line are sequentially supplied to the output section.

After all the picture elements in the first horizontal scanning line are read out, the signal charges from the pair picture elements 23c and 23d in the second horizontal scanning line 24b, which is an even number order line, are transferred in a zig-zag fashion as shown by dashed arrows in FIG. 4 or 6 to the transfer electrodes $\phi_2$, which are of the same phase but are found in different positions. Then, they are transferred through the respective shift registers 21 to the single shift register 26 to be sequentially read out in the manner as described above.

As an alternative method of transfer, it is possible to transfer the signal charges from the picture elements 23a and 23c to the transfer electrodes $\phi_1$ of the same phase but in the different positions and transfer the signal charges from the picture elements 23b and 23d to the transfer electrodes $\phi_2$.

Figure 8:
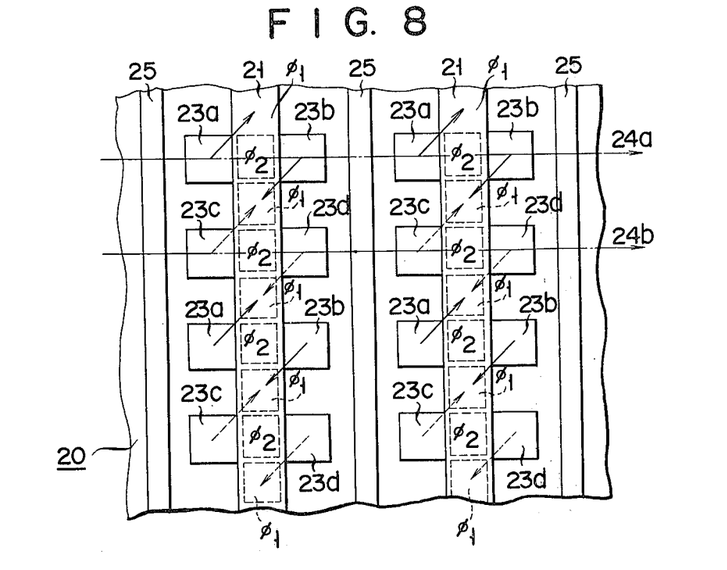
FIG. 8 is a fragmentary schematic plane view showing a solid-state image pick-up device embodying the invention for illustrating an example of the method of transferring signal charges from the picture elements to the shift registers.
Figure 9:
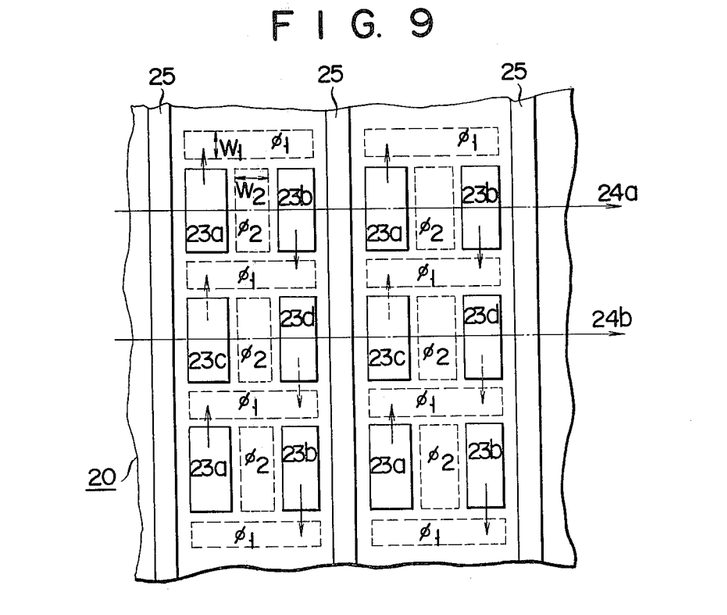
FIG. 9 is a fragmentary schematic plane view showing a specific example of the arrangement of the shift register transfer electrodes and picture elements in the device shown in FIG. 8.

FIGS. 8 and 9 show a further alternative method of transfer. In this case, the signal charges from the picture elements 23a and 23d are transferred to the transfer electrode $\phi_1$ of the same phase and in the same position in each shift register 21, and the signal charges from the picture elements 23b and 23c are transferred to the transfer electrode $\phi_1$ of the same phase and in the next position through the intervening transfer electrode $\phi_2$.

FIG. 9 shows a specific example of the arrangement. In this example, the transfer electrodes $\phi_1$ in each shift register 21 extend in the horizontal direction, while the transfer electrodes $\phi_2$ extend in the direction of the column. In other words, these transfer electrodes extend perpendicular to each other to form a lattice-like array. In FIGS. 8 and 9, like parts as those in FIG. 4 are designated by like reference numerals, and their description is omitted. According to this embodiment, the construction and arrangement of the transfer electrodes $\phi_1$ and $\phi_2$ permit very ready manufacture. Also, the transfer electrodes may be made extremely narrow, thus permitting the picture element pitch both in the horizontal direction and the direction of the column. This is very advantageous for increasing the number of picture elements in the solid-state image pick-up device.

Figure 10:
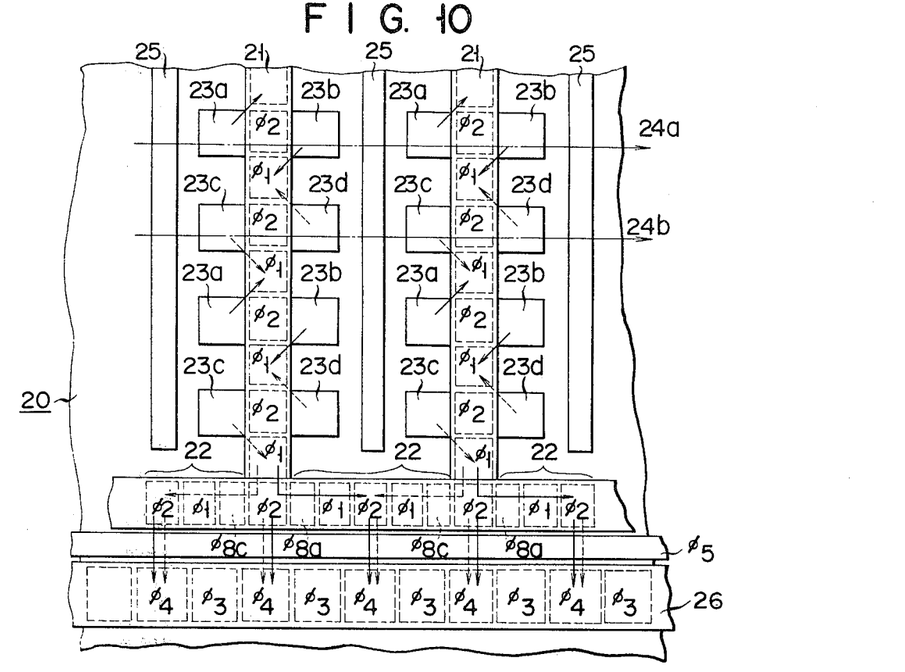
FIG. 10 is a fragmentary schematic plane view showing a different embodiment of the solid-state image pick-up device according to the invention.

FIG. 10 shows an embodiment of the invention, in which the signal charges from the picture elements are transferred to only the transfer electrodes $\phi_1$ of the shift registers 21. Here, the order of the transfer of the signal charges from the pair picture elements 23a and 23b in the odd number order horizontal scanning lines 24a to the transfer electrodes $\phi_1$ is different from that of the transfer of signal charges from the pair picture elements 23c and 23d in the even number order horizontal scanning lines 24b to the transfer electrodes $\phi_1$. More particularly, in the odd number order horizontal scanning lines 24a, the signal charges from the picture elements 23b are transferred prior to the transfer of those from the picture elements 23a to the transfer elctrodes $\phi_1$, and in the even number order horizontal scanning lines 24b the signal charges from the picture elements 23c are transferred prior to the transfer of those in the picture elements 23d to the transfer electrodes $\phi_1$.

Each shift register 21 has a register section 22 extending parallel to the horizontal scanning lines at its lower end. In these register sections 22, the signal charges from the picture elements 23a and 23b in the odd number order horizontal scanning lines are transferred to the right as shown by solid arrows, while the signal charges from the picture elements 23c and 23d in the even number order horizontal scanning lines are transferred to the left as shown by dashed arrows. In this case, it is necessary to switch the directions of transfer of signal charges having been transferred through each shift register 21 to the left or right in the register section 22.

For this distribution of signal charges, control gates $\phi_{8a}$ and $\phi_{8b}$ are provided respectively in the left hand and right hand portions of the register section 22. The signal charges from the picture elements in one horizontal scanning line, having been transferred through the plurality of shift registers 21, are temporarily held in the register sections 22 and then simultaneously transferred to a single shift register 26 by the action of a shift electrode $\phi_5$. From the single shift register 26, the signal charges are read out to an output section (not shown) line after line.

Figure 11:
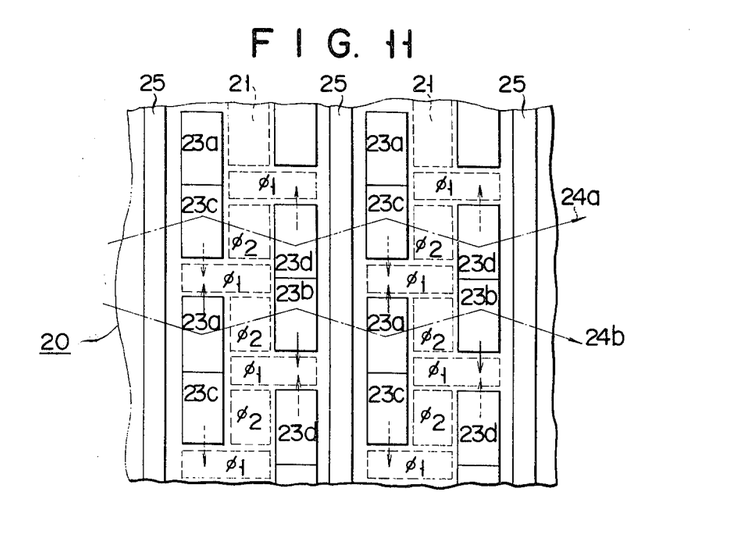
FIG. 11 is a fragmentary schematic plane view showing a specific example of the arrangement of the shift register transfer electrodes and picture elements in the device shown in FIG. 10.

FIG. 11 shows a specific example of the arrangement of the transfer electrodes in the shift registers 21 and picture elements in the device of FIG. 10. Here, on one side of each shift register 21, picture element pairs each consisting of picture elements 23a and 23c and transfer electrodes $\phi_1$ are alternatively arranged in the direction of the column. Similarly, picture element pairs, each consisting of picture elements 23b and 23d and transfer electrodes $\phi_1$, are alternately arranged in the direction of the column. In this case, the signal charges from adjacent picture elements 23c and 23a on the upper and lower sides of corresponding transfer electrodes $\phi_1$ are transferrred to transfer electrodes $\phi_1$. Those charges from the other picture elements 23b and 23d are transferred to the other transfer electrodes $\phi_1$ of the same phase.

A further embodiment of the invention will now be described with reference to FIGS. 12 to 14.

Figure 12:
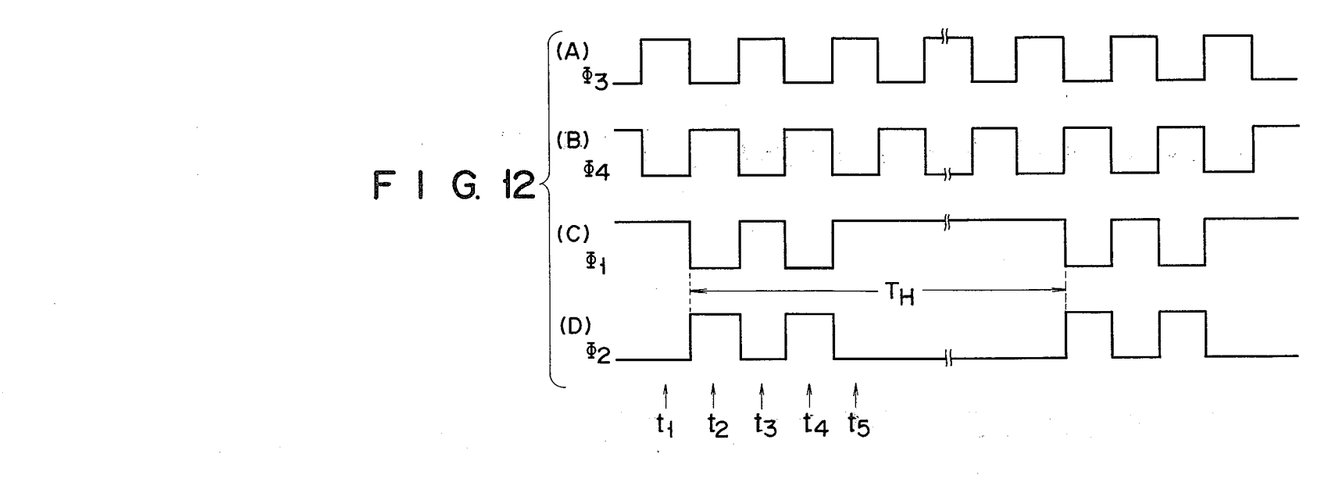

While in the embodiment shown in FIG. 4 clock pulses of the same period are supplied to the individual transfer electrodes in the plurality of shift registers 21 and single shift register 26, in this embodiment, clock pulses as shown in FIG. 12 are supplied. In this case, clock pulse signals $\Phi_3$ and $\Phi_4$ which are different in phase but of the same waveform, as shown in FIG. 12(A) and FIG. 12(B), are supplied to the transfer electrodes $\phi_3$ and $\phi_4$ in the single shift register 26, while clock pulse signals $\Phi_1$ and $\Phi_2$ provided with a period $T_H$ of reading out the signal charges from the picture elements in one horizontal scanning line, as shown in FIG. 12(C) and FIG. 12(D), are supplied to the transfer electrodes $\phi_1$ and $\phi_2$ in the plurality of shift registers 21.

Figure 13:
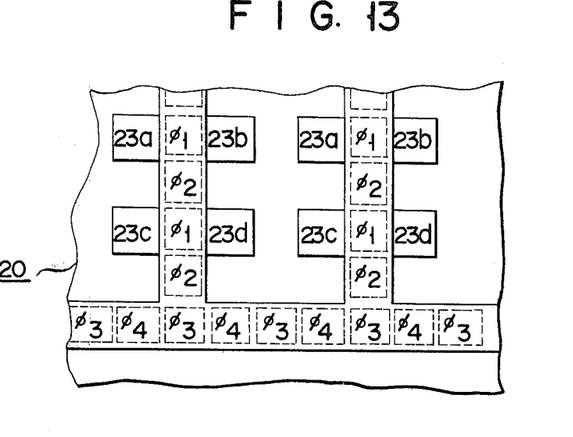
FIG. 13 is a fragmentary schematic plane view showing an example of the arrangement of shift registers and transfer electrodes in case when the clock pulses shown in FIGS. 12(A), (B), (C) and (D) are supplied.

By varying the transfer speed of the supplied clock pulses in this way, it is possible to omit the register sections 22 in the embodiment of FIG. 4, that is, the signal charges having been transferred through the shift registers 21 can be directly transferred to single shift register as shown in FIG. 13.

Figure 14:
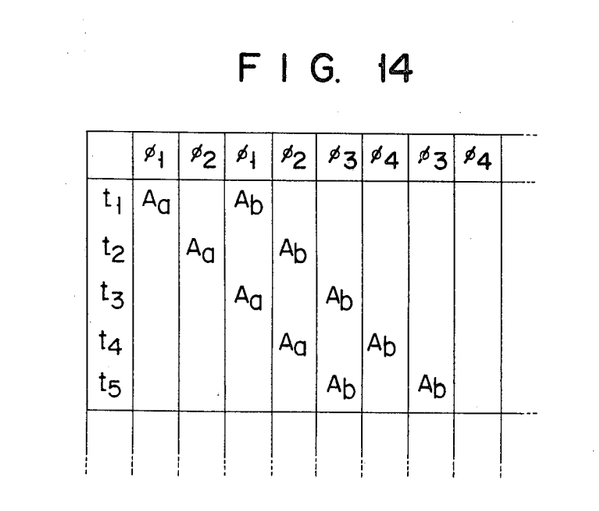
FIG. 14 is a view illustrating how signal charges are transferred to the transfer electrodes in the shift registers shown in FIG. 13 at instants $t_1$ to $t_5$ in FIGS. 12(A), (B), (C) and (D).

FIG. 14 shows how the signal charges from the picture elements 23a and 23b in an odd number order horizontal scanning line, respectively indicated by $A_a$ and $A_b$, are transferred to successive transfer electrodes $\phi_1$, $\phi_2$, $\phi_1$ and $\phi_2$ in each of the shift registers 21 and transfer electrodes $\phi_3$, $\phi_4$, $\phi_3$ and $\phi_4$ in the single shift register 26 at successive instants $t_1$ to $t_5$ shown in FIG. 12.

While in the above embodiments the shift registers 21 are of the surface channel type formed on the semiconductor substrate 20, they may be of the buried channel type as well.

What we claim is:

1. A solid-state image pick-up device comprising:
   a semiconductor substrate;
   a plurality of picture elements arranged for information transfer on said semiconductor substrate in vertical columns and horizontal scan lines, said picture elements having a predetermined horizontal pitch interval and storing signal charges;
   a plurality of shift registers arranged on said semiconductor substrate and extending vertically between two adjacent columns of picture elements for shifting said signal charges stored in said picture elements forming said adjacent columns, each of said plurality of shift registers including at one end a register section extending horizontally;
   an output section; and
   a single horizontal shift register adjacent to said horizontal register sections and to said output section for transferring said signal charges in said plurality of shift registers to said output section, said single shift register receiving simultaneously from each register section a pair of picture elements.

2. The solid-state image pick-up device according to claim 1, wherein each of said plurality of shift registers has storage regions and transfer regions said transfer regions being narrower than said storage regions.

3. The solid-state image pick-up device according to claim 2, wherein said picture elements are arranged in a horizontal direction at a pitch determined by the width of said picture elements and the width of said transfer regions.

4. The solid-state image pick-up device according to claim 1, wherein each of said plurality of shift registers includes a plurality of first transfer electrodes extending vertically between said adjacent columns of picture elements and a plurality of second transfer electrodes extending horizontally between adjacent first transfer electrodes.

* * * * *